(12) United States Patent
Laviron et al.

(10) Patent No.: US 6,613,609 B1
(45) Date of Patent: Sep. 2, 2003

(54) METHOD FOR PRODUCING A PORTABLE ELECTRONIC DEVICE WITH AN INTEGRATED CIRCUIT PROTECTED BY A PHOTOSENSITIVE RESIN

(75) Inventors: Thierry Laviron, Peynier (FR); Christian Leriche, Trets (FR); Jean Pierre Fournier, La Ciotat (FR)

(73) Assignee: Gemplus, Gemenos (FR)

( * ) Notice: Subject to any disclaimer, the term of this patent is extended or adjusted under 35 U.S.C. 154(b) by 0 days.

(21) Appl. No.: 09/959,100

(22) PCT Filed: Apr. 28, 2000

(86) PCT No.: PCT/FR00/01149
§ 371 (c)(1),
(2), (4) Date: Oct. 18, 2001

(87) PCT Pub. No.: WO00/67316
PCT Pub. Date: Nov. 9, 2000

(30) Foreign Application Priority Data

Apr. 28, 1999 (FR) .............................................. 99 05394

(51) Int. Cl.[7] ................................................. H01L 21/44
(52) U.S. Cl. .................... 438/125; 438/112; 438/116; 438/127; 438/464; 438/465; 438/113
(58) Field of Search ................... 438/112, 116, 438/462, 64, 460, 113, 464, 465, 107, 127, 125, 780, 22, 36, 455, 714, 82, 99

(56) References Cited

U.S. PATENT DOCUMENTS

| | | | | |
|---|---|---|---|---|
| 4,208,005 A | * | 6/1980 | Nate et al. ................... 228/175 |
| 4,822,536 A | * | 4/1989 | Voinis et al. .................. 264/22 |
| 5,189,094 A | * | 2/1993 | Umetani et al. ............... 522/27 |
| 5,219,795 A | * | 6/1993 | Kumai et al. ................. 438/107 |
| 5,376,502 A | | 12/1994 | Novak et al. |
| 5,382,310 A | * | 1/1995 | Ozimek et al. .......... 156/257.5 |
| 5,647,122 A | * | 7/1997 | Launay et al. ................. 29/840 |
| 5,677,362 A | * | 10/1997 | Bachmann et al. ............ 522/28 |
| 5,743,981 A | * | 4/1998 | Lu ................................ 156/82 |
| 5,776,798 A | * | 7/1998 | Quan et al. .................. 438/112 |

FOREIGN PATENT DOCUMENTS

| | | |
|---|---|---|
| DE | 19640304 A1 | 4/1998 |
| EP | 0470559 A1 | 2/1992 |
| EP | 0670595 A1 | 9/1995 |
| JP | 62235315 | 10/1987 |
| JP | 2-97561 | 4/1990 |
| JP | 04368137 | 12/1992 |
| JP | 10060232 | 3/1998 |
| JP | 11-100489 | 4/1999 |

OTHER PUBLICATIONS

Database WPI, Section Ch, Week 199020, Derwent Publications Ltd., London, Great Britain, "Sealing Resin Composition Low Linear Expansion Coefficient Obtain Compound Poly Maleimide Compound Poly Allyl Compound Inorganic Fill".

* cited by examiner

Primary Examiner—Matthew Smith
Assistant Examiner—Igwe U. Amy
(74) Attorney, Agent, or Firm—Burns, Doane, Swecker & Mathis, L.L.P.

(57) ABSTRACT

In a method for producing a portable electronic device with an integrated circuit, a resin band is deposited around the chip of an integrated circuit and connection wires. The resin is highly viscous and can be polymerized with U.V. radiation. A low-viscosity filling resin which can be polymerized with U.V. radiation is deposited in the space defined by the resin band, and the protected resins are polymerized by exposure to U.V. radiation. The filling resin contains mechanically reinforcing fibers. The entire process can be carried out in a continuous manner.

41 Claims, 2 Drawing Sheets

METHOD FOR PRODUCING A PORTABLE ELECTRONIC DEVICE WITH AN INTEGRATED CIRCUIT PROTECTED BY A PHOTOSENSITIVE RESIN

This disclosure is based upon French Application No. 99/05394, filed on Apr. 28, 1999 and International Application No. PCT/FR00/1149, filed Apr. 28, 2000, which was published on Nov. 9, 2000 in a language other than English, the contents of which are incorporated herein by reference.

BACKGROUND OF THE INVENTION

The present invention relates to the manufacture of a portable electronic device, having at least one integrated circuit chip embedded in a support and electrically connected to interface elements constituted by a connection terminal block and/or an antenna.

These portable electronic devices constitute for example smart cards, with and/or without contacts, or electronic labels.

Smart cards with and/or without contacts are designed for carrying out various operations such as, for example, banking operations, telephone communications, various identification operations, or remote ticketing type operations.

Cards with contacts have metallizations exposed on the surface of the card, disposed at a precise place on the card body, defined by the usual standard ISO 7816. These metallizations are designed to come into contact with a read head of a reader with a view to electrical data transmission.

Contactless cards have an antenna making it possible to exchange information with the outside world by means of electromagnetic coupling between the card electronics and a receiver or reader. This coupling can be performed in read mode or in read/write mode, and the data transmission takes place by radiofrequency or ultrahigh frequency.

There are also hybrid cards or "combicards" which have both metallizations exposed on the surface of the card and an antenna embedded in the body of the card. This type of card can therefore exchange data with the outside world in either contact or contactless mode.

As implemented at present, the cards, with or without contacts, are portable items of small thickness and standardized dimensions. ISO standard 7810 corresponds to a standard format card, 85 mm long, 54 mm wide and 0.76 mm thick.

The majority of smart card manufacturing methods are based on assembly of the integrated circuit chip in a subassembly referred to as a micromodule which is inset, that is to say placed in a cavity made in the card body, using techniques known to persons skilled in the art.

A conventional method of manufacturing a micromodule with contacts is illustrated in FIG. 1. Such a method consists of gluing an integrated circuit chip 10 by disposing its active face with its contact pads 12 upward, and gluing its opposite face on a dielectric support sheet 15. The dielectric sheet 15 is itself disposed on a contact grid 18 such as a metal plate made of nickel-plated and gold-plated copper for example. Connection wells 16 are made in the dielectric sheet 15 in order to allow connecting wires 17 to connect the contact pads 12 of the chip 10 to the contact areas of the grid 18.

According to certain variants, it is possible to glue the chip 10, active face upward, directly on the contact grid 18, and then connect it by wiring 17.

In the case of a contactless micromodule, an antenna, deposited on the dielectric support by serigraphy or some other means, is connected to the metal grid.

In a variant embodiment, the chip can also be glued on a dielectric support and connected to defined connection areas on said support. The micromodule thus obtained can subsequently be connected by soldering or gluing to a wire antenna, etched or deposited by serigraphy.

A protection or encapsulation step next protects the chip 10 and the soldered connecting wires 17. Use is generally made of a technique referred to as "glob top", which designates the coating of the chip from the top. This technique consists of using a drop of resin 20, epoxy-based for example, thermosetting or cross-linked by ultraviolet.

Generally, use is made of a three-dimensional thermal resin which requires a polymerization step under operating conditions onerous to implement. This is because time in an oven at over 90° C. for a period of possibly as much as 24 hours is necessary, which necessitates an extended method time, suitable equipment and the intervention of an operator.

It is also possible to use resins polymerizable by exposure to ultraviolet. However, such resins are generally too flexible, which leads to electrical operation and stress problems when the chip is subjected to bending forces.

Resins polymerizable by ultraviolet are therefore rarely used directly as protection according to the conventional "glob top" technique.

Deposition of the resin 20 on the chip and the connecting wires can be carried out directly on the dielectric film for chips of small dimensions.

Nevertheless, in order to limit the risks of the resin running over the edges of the circuit, it is advantageous to delimit the surface of spreading of the drop of resin by a barrier so as to obtain a reproducible protective shape.

FIG. 2 illustrates deposition of a barrier 25 on the dielectric film 15. This barrier 25 can be made of polymer, such as epoxy, silicone or a polyester. It surrounds the chip 10 and can be deposited on the dielectric film 15 by serigraphy or by a distribution method.

This barrier 25 can also consist of a metal frame stamped and glued on the dielectric film 15 around the chip 10.

Depending on the particular case, this barrier 25 is deposited on the support 15 in a step of the manufacturing method, or it can be delivered directly by the supplier of the dielectric support 15.

The presence of a barrier 25 surrounding the chip 10 facilitates deposition of the protective resin 20 but does not necessarily make it possible to avoid the milling step, essential when too large a drop of resin has been deposited. This is because the drop of resin can hamper insetting of the micromodule by an overlarge excess thickness.

Milling makes it possible to optimize the height and shape of the protective resin.

However, milling constitutes a stressful operation for the connected chip.

Furthermore, this operation requires great precision in order not to damage the connection or the active face of the chip.

In addition, milling constitutes an additional step in the manufacturing method and has a non-negligible cost.

A micromodule 50, constituted by the chip 10 transferred on to the dielectric support strip 15 and connected to a communication interface 18, is next inset in the cavity of a previously decorated card body.

This insetting operation can be performed by deposition of a liquid glue in the cavity of the card body before transfer of the micromodule, or by deposition of a heat-activated adhesive film by hot rolling on the dielectric film 15 and by hot pressing by means of a press, the shape of which is adapted to that of the cavity of the card body.

These conventional methods of manufacturing micromodules nevertheless have many drawbacks.

On the one hand, the presence of a ring for confining the protective resin is often not sufficient to avoid milling. There results therefrom a covering of the chip which is not optimized and there is not full control over the geometry of the micromodule, in particular on the edges of the chip. Overflow of the resin can lead to the micromodule being scrapped.

It is important to have good control over the thickness of the micromodule, and therefore the height of the protective resin, in order to produce extra flat integrated circuit devices.

Furthermore, the fitting or purchase of a film with a barrier, whatever this is, and/or the milling of the resin have a non-negligible cost.

On the other hand, the use of a thermal resin, traditionally used in the conventional encapsulation technique, imposes too long a polymerization time for a continuous manufacturing method.

SUMMARY OF THE INVENTION

The aim of the present invention is to overcome the drawbacks of the prior art.

To that end, the present invention proposes a smart card manufacturing method making it possible to combine reliability of the finished product with simplicity and a reduction in the number of manufacturing steps.

In particular, the present invention proposes depositing protection for the micromodule using a method known by the name "DAM and FILL" which designates a method of protecting the integrated circuit chip in two steps.

First, a high-viscosity resin band, "DAM", is deposited around the chip and its connecting wires.

Next, a filling resin, "FILL", covers the chip and its wires in the space delimited by the resin band.

According to one essential characteristic of the invention, the resins used for the band and for the filling are both resins polymerizable by exposure to ultraviolet.

According to one particular feature of the invention, both resins contain mechanical reinforcing means and notably glass fibres.

A more particular object of the present invention is a method of manufacturing a portable electronic device with an integrated circuit, characterised in that it has the following steps:

deposition of a high-viscosity resin band, polymerizable by ultraviolet, around the integrated circuit chip and its connecting wires;

deposition of a low-viscosity filling resin, polymerizable by ultraviolet, in the space delimited by the resin band;

polymerization of the protective resins by exposure to ultraviolet.

According to one characteristic of the invention, at least the filling resin has mechanical reinforcing fibres.

According to one particular feature, the reinforcing fibres are glass fibres.

Advantageously, the percentages of glass fibres contained in the resins are between 5% and 20%.

According to another characteristic, the protective resins are cationic epoxy resins.

According to the preferential embodiment, the different steps of the method are carried out one after the other and continuously, and the polymerization step is carried out simultaneously on the two resins.

According to another characteristic, the resins also contain a small percentage of extractible fluoride ions, some of said ions being neutralized by addition of chemical compounds of magnesium.

According to one particular feature, the amounts of fluoride ions contained in the resins are between 20% and 40% of the usual concentrations, the latter being greater than or equal to 250 ppm.

According to another characteristic, the resins also contain elasticising agents comprising one or a mixture of a number of oligomeric alcohols.

According to one particular feature, the oligomeric alcohols are polyesters and/or polycarbonates and/or polyethers and/or polybutadienes and/or the copolymers thereof.

According to another characteristic, the resins also contain one or a mixture of a number of photoinitiators.

According to one particular feature, the photoinitiators are triarylsulphonium salts.

According to another characteristic, the resins also contain monomers and/or oligomers polymerizable cationically under ultraviolet.

According to one particular feature, the monomers and/or oligomers are cycloaliphatic epoxides.

According to one particular feature of the invention, the resin band has a viscosity greater than or equal to 150,000 cps.

According to another particular feature of the invention, the filling resin has a viscosity less than or equal to 6000 cps.

The present invention also relates to an electronic module having a chip transferred on to a dielectric support and connected to a communication interface, characterised in that it comprises a protection of the chip and of its connecting wires consisting of two distinct resins including at least one photoinitiator, a first resin constituting a band on the periphery of the protection and a second resin filling the space delimited by the resin band.

According to a variant embodiment, the resin band overlaps the chip and its connecting wires so as provide rigidity of the micromodule.

The method according to the invention is simple to implement and simplifies the prior methods.

In particular, the barrier deposition and milling steps are eliminated, and the polymerization time is considerably shortened by the use of resins cross-linked by ultraviolet. This allows significant productivity gains and unit manufacturing cost savings.

Deposition of the resin band is carried out in time masked in relation to deposition of the filling resin. The overall time for encapsulation of the chip and its wires is therefore equal to the time for depositing a drop of resin in the conventional "glob top" technique.

Furthermore, the method according to the invention uses photosensitive resins despite the prejudices generally associated with such resins.

In addition, the two resins are polymerized simultaneously in the continuity of the manufacturing method, following the depositions.

The method according to the present invention makes it possible to achieve manufacturing rates of 12,000 items per hour continuously.

Furthermore, the manufacturing method according to the invention has the advantage of having full control over the thickness of the chip protection.

In addition, the protection has good impervious qualities, since the two resins mix together slightly before being polymerized by simple exposure to ultraviolet in the continuity of the manufacturing line.

The nature of the resin band, in addition to its function of limiting the spreading of the protection, contributes towards the protection and rigidity of the micromodule.

The resins used in the method according to the invention make it possible to increase the quality and reliability of the electronic device obtained.

BRIEF DESCRIPTION OF THE DRAWINGS

Other particular features and advantages of the invention will emerge from a reading of the description given as an illustrative and non-limitative example and produced with reference to the accompanying drawings which depict.

DESCRIPTION OF THE INVENTION

Figure 1:
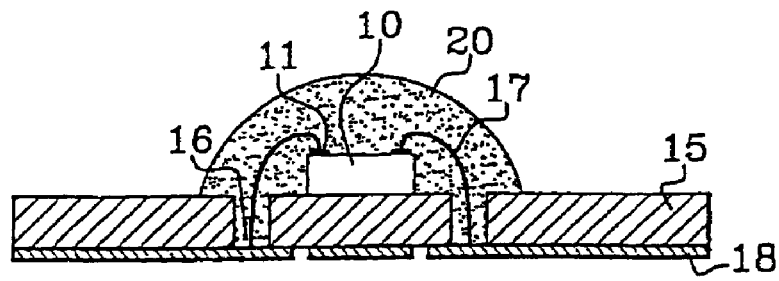
FIG. 1, already described, is a cross-sectional diagram illustrating a traditional smart card manufacturing method.
Figure 2:
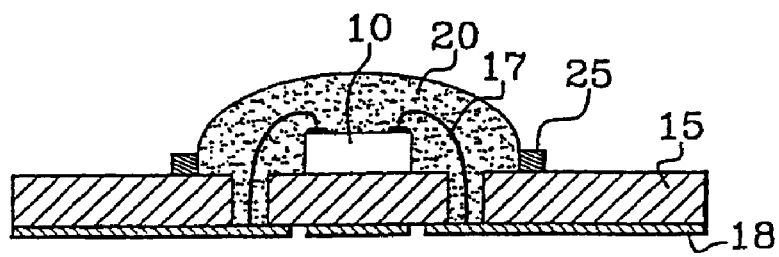
FIG. 2, already described, is a cross-sectional diagram illustrating the deposition of a barrier delimiting the spread of the protective resin.
Figure 3:
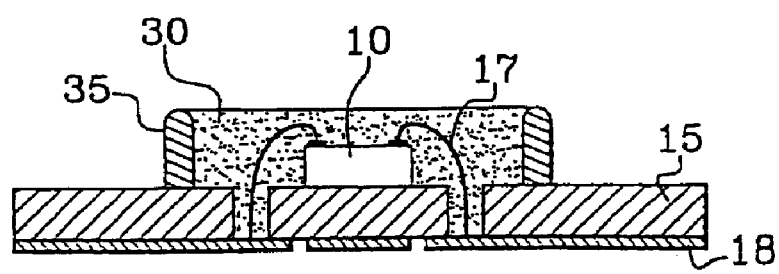
FIG. 3 is a cross-sectional diagram of the micromodule obtained according to the method of the present invention.

Referring to FIG. 3, an integrated circuit chip 10 is glued on a dielectric support 15 and connected to a communication interface 18 by wiring 17.

The manufacturing method according to the invention consists of protecting the micromodule, constituted by the chip 10 and its connecting wires 17, by depositing two different resins, in two steps, in a continuous method.

A first resin 35 is deposited on the periphery of the micromodule in order to constitute a band all around the chip 10 and its wires 17.

This resin band 35 is advantageously composed of a resin of high viscosity, preferentially greater than or equal to 150,000 cps.

A second resin 30 is then deposited in the space delimited by the resin band 35 in order to fill this space and completely cover the chip 10 and its connecting wires 17.

This filling resin 35 is advantageously composed of a resin of low viscosity, preferentially less than or equal to 6000 cps.

The resins used, for the band 35 and for the filling 30, have chemical properties specifically adapted to the manufacturing method according to the invention.

In particular, at least the filling resin 30 comprises mechanical reinforcing means which can be in the form of fibres and notably glass fibres.

In addition, the resin constituting the band 35 can advantageously have this same particular feature of mechanical reinforcement.

According to a preferential embodiment, the resins 30 and 35 are cationic epoxy resins containing a large percentage of glass fibres of which the shape factor, that is to say the factor of the length of the fibre over its diameter (L/d), is specifically adapted to the desired application.

The presence of glass fibres in the resins 30 and 35 provides an adapted elasticity of the protection, a low thermal expansion coefficient, a controlled spread of the deposit, and a reduction of the shrinkage related to polymerization of the resins.

The resins 30 and 35 also contain a small percentage of extractible fluoride ions. The addition of chemical compounds of magnesium in fact neutralizes some of the fluorides which are then no longer extractible.

A compound is obtained containing only 20% to 40% of the usual levels of fluoride ions generally contained in conventionally used resins, it being known that these usual levels are greater than or equal to 250 ppm. Resins with a fluoride ion level less than or equal to 100 ppm are thus obtained.

The small amount of these fluoride ions improves the electrical properties of the resins.

Furthermore, the resins 30 and 35 contain elasticising agents with very little rigidity and hardness in order to avoid cracking in the protection.

These elasticising agents are based on oligomeric alcohol structures, of the type of polyesters, polycarbonates, polyesthers, polybutadienes, and/or their copolymers, for example.

These elasticising agents can be used alone or in a mixture of a number of them in the composition of the resins 30 and 35.

Photoinitiators are also included in the composition of the resins 30 and 35. They can be, for example, triarylsulphonium salts used alone or in a mixture.

These photoinitiators make it possible to adapt the absorption wavelength to the emission wavelengths of the ultraviolet lamps used for polymerizing the resins.

Furthermore, these photoinitiators make it possible above all to facilitate adherence of the resins on the dielectric support 15.

In fact, adherence and polymerization of the resins 30 and 35 is not obvious since the reaction is neutralized by the specific composition of the photoinitiators which does not adhere easily on the dielectric 15.

Furthermore, polymers and/or oligomers polymerizable cationically under ultraviolet are included in the composition of the resins 30 and 35, and more particularly cycloaliphatic epoxides which are the only ones to bring about polymerization under ultraviolet.

All the elements constituting the resins 30 and 35 are mixed in proportions determined by persons skilled in the art according to the desired applications.

In particular, the proportions will be different for the filling resin 30 and the resin band 35.

The resin band 35 allows a barrier to be made in order to limit the spreading of the protective resin.

Furthermore, the deposition of a resin band makes it possible to have full control over the height and shape of the micromodule protection.

As the filling resin 30 is of low viscosity, it fills the space delimited by the resin band 35 up to the edge thereof.

The milling step is thus eliminated.

Preferentially, the resin band 35 has a height greater than or equal to the height of the chip 10 with its connecting wires 17, so that the filling resin 30 encompasses the connecting wires 17.

The method according to the present invention makes it possible to obtain micromodules with a thickness less than or equal to 580 µm, which is considerably below the ISO standards.

Figure 4:
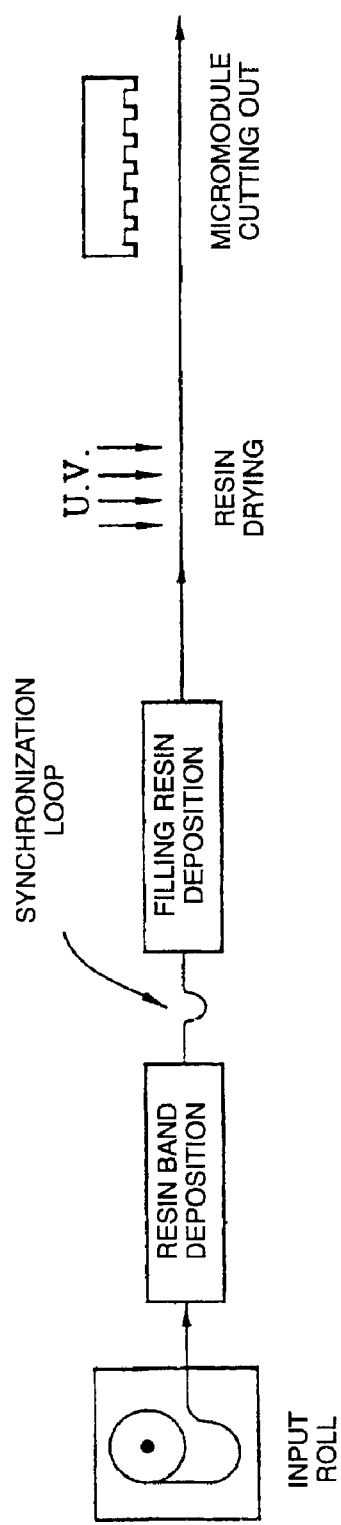
FIG. 4 is a block diagram of the different steps of the manufacturing method according to the present invention.

FIG. 4 illustrates schematically the steps of the manufacturing method according to the present invention.

A support film 15, on which integrated circuit chips 10 are glued and connected, is unwound according to a conventional electronic device manufacturing line method.

A first deposition station produces the resin band around each chip with a first injection head.

According to a preferential embodiment, the resin band injection head is a multivalve programmable head. In particular, twelve depositions are performed simultaneously with a round, square, oval or some other shape according to the program chosen for the desired application.

A second deposition station, situated in the continuity of the manufacturing line, delivers the filling resin with a second injection head. This second injection head has the same number of valves as the first. It delivers a drop of filling resin of very low viscosity, calibrated so as to completely fill the space delimited by the resin band.

A synchronization loop between the two deposition stations makes it possible to avoid any tension on the support film.

According to one particular feature of the invention, deposition of the resin band is carried out in time masked in relation to deposition of the filling resin. The time for depositing protection on the chips and their connecting wires is therefore equivalent to the time for depositing a drop of resin in a conventional "glob top" method.

The method according to the invention next has a step of drying the deposited resins carried out continuously following the depositions.

The film supporting the chips covered with the two resins passes through an area of exposure to ultraviolet over a given distance in order to polymerize the resins.

Determining the proportions of the constituent elements of the resins 30 and 35 allows an adjustment of the manufacturing conditions such as the polymerization speed which fixes the production rate.

The manufacturing method according to the invention makes it possible to achieve a manufacturing rate of 12,000 items per hour. This speed of travel of the chips on the support is compatible with the equipment described, and the area of exposure to ultraviolet does not exceed two metres in length.

The micromodules are then cut out with a punch for example, in order to be disposed in a card body for example, according to known techniques such as lamination, moulding, etc.

Figure 5:
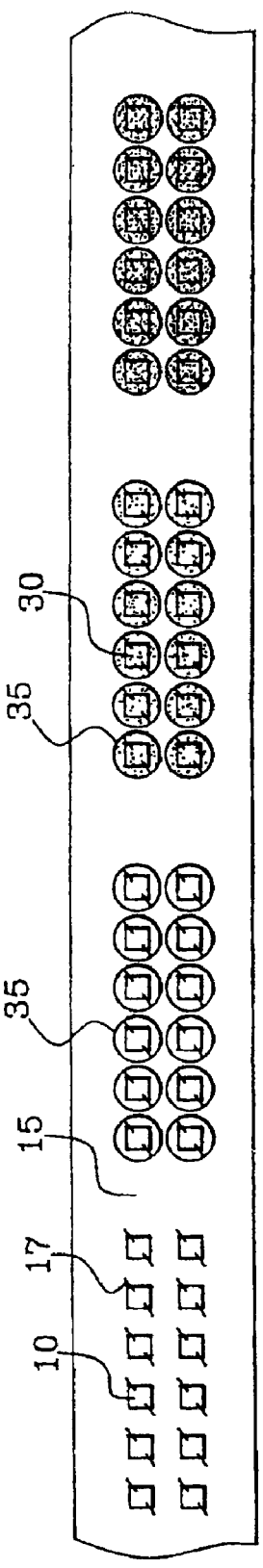
FIG. 5 is a top view diagram of the protection steps according to the method of the present invention.

FIG. 5 is a schematic top view of the steps for depositing the protection according to the method of the present invention.

Integrated circuit chips 10 are glued on a support 15 and connected by connecting wires 17.

A resin band 35 is deposited in an adapted shape around each chip 10.

The composition of the resins 30 and 35 also makes it possible to adjust their mechanical properties in order to avoid stresses prejudicial to the quality and operation of the micromodules obtained by the method.

According to variants, the resin band 35 can optionally overlap the chip 10 and/or the connecting wires 17.

This is because the resin band 35, besides its function of limiting spreading, fulfils a protective function just like the filling resin 30 as well as a function providing rigidity and stability for the micromodule. It is consequently advantageous for the resin of the band 35 to be as close as possible to the chip 10 and its wires 17.

The filling resin 30 next fills the space delimited by the resin band 35. The two resins 30 and 35 mix together slightly on their periphery.

Exposure to ultraviolet polymerizes the resins and thus obtains a thin, impervious and reproducible protection.

Polymerization of the resins used by exposure to ultraviolet makes it possible to avoid a break in the manufacturing rhythm by eliminating the traditional many hours of oven drying for thermal resins.

What is claimed is:

1. A method of protecting a portable electronic device with an integrated circuit provided with connections, comprising the following steps that are carried out one after the other:

depositing a resin band, polymerizable by ultraviolet, around the integrated circuit and its connections;

depositing a lower-viscosity filling resin, polymerizable by ultraviolet, in a space delimited by the band; and simultaneously polymerizing the two resins by exposure to ultraviolet radiation, wherein at least one of the resins contains at least one photoinitiator, and, after polymerization, this resin has a percentage of extractible fluoride ions, and further including the step of neutralizing said fluoride ions by addition of a chemical compound of magnesium.

2. A method according to claim 1, wherein the filling resin has mechanical reinforcing fibers.

3. A method according to claim 2, wherein the percentage of fibers contained in the resin is between 5% and 20%.

4. The method of claim 2, wherein said reinforcing fibers are glass fibers.

5. A method according to claim 1, wherein at least one of the resins is a cationic epoxy resin.

6. A method according to claim 1, wherein the amount of fluoride ions contained after polymerization in the resin is no greater than 100 ppm.

7. A method according to claim 1, wherein at least one of the resins contains at least one elasticizing agent comprising at least one oligomeric alcohol.

8. A method according to claim 1, wherein at least one of the resins contains at least one monomer and/or oligomer that is polymerizable cationically under ultraviolet.

9. A method according to claim 1, wherein the deposited band has a viscosity greater than or equal to 1500 poise.

10. A method according to claim 1, wherein the deposited filling has a viscosity less than or equal to 60 poise.

11. The method according to claim 1, wherein the depositing and polymerizing steps are carried out continuously, wherein the step of depositing a resin band includes depositing a high viscosity resin band having a viscosity of the order of 1500 poise, wherein the lower-viscosity filling resin has a viscosity of the order of 60 poise, and wherein after polymerization, the resin which contains the at least one photoinitiator has a low percentage of extractible fluoride ions.

12. A method according to claim 1, wherein the resin containing the photoinitiator has a low percentage of extractable fluoride ions after polymerization.

13. A method of protecting a portable electronic device with an integrated circuit provided with connections, comprising the following steps that are carried out one after the other:

depositing a resin band, polymerizable by ultraviolet, around the integrated circuit and its connections;

depositing a lower-viscosity filling resin, polymerizable by ultraviolet, in a space delimited by the band; and simultaneously polymerizing the two resins by exposure to ultraviolet radiation, wherein at least one of the resins contains at least one elasticising agent comprising at least one oligomeric alcohol, and wherein the oligomeric alcohol is at least one of a polyester, a polycarbonate, polyethers, a polybutadiene or the copolymers of said alcohols.

14. The method according to claim 13, wherein the depositing and polyermizing steps are carried out continuously, wherein the step of depositing a resin band includes depositing a high viscosity resin band having a viscosity of the order of 1500 poise, and wherein the lower-viscosity filling resin has a viscosity of the order of 60 poise.

15. A method according to claim 13, wherein the filling resin has mechanical reinforcing fibers.

16. A method according to claim 15, wherein the percentage of fibers contained in the resin is between 5% and 20%.

17. The method of claim 15, wherein said reinforcing fibers are glass fibers.

18. A method according to claim 13, wherein at least one of the resins is a cationic epoxy resin.

19. A method according to claim 13, wherein at least one of the resins contains a photoinitiator.

20. A method according to claim 13, wherein at least one of the resins contains at least one monomer and/or oligomer that is polymerizable cationically under ultraviolet.

21. A method according,to claim 13, wherein the deposited band has a viscosity greater than or equal to 1500 poises.

22. A method according to claim 13, wherein the deposited filling has a viscosity less than or equal to 60 poises.

23. A method of protecting a portable electronic device with an integrated circuit provided with connections, comprising the following steps that are carried out one after the other:

depositing a resin band, polymerizable by ultraviolet, around the integrated circuit and its connections;

depositing a lower-viscosity filling resin, polymerizable by ultraviolet, in a space delimited by the band; and simultaneously polymerizing the two resins by exposure to ultraviolet radiation, wherein at least one of the resins contains at least one monomer and/or oligomer that is polymerizable cationically under ultraviolet, and wherein the monomer and/or oligomer is a cycloaliphatic epoxide.

24. The method according to claim 23, wherein the depositing and polymerizing steps are carried out continuously, wherein the step of depositing a resin band includes depositing a high viscosity resin band having a viscosity of the order of 1500 poise, and wherein the lower-viscosity filling resin has a viscosity of the order of 60 poise.

25. A method according to claim 23, wherein the filling resin has mechanical reinforcing fibers.

26. A method according to claim 25, wherein the percentage of fibers contained in the resin is between 5% and 20%.

27. The method of claim 25, wherein said reinforcing fibers are glass fibers.

28. A method according to claim 23, wherein at least one of the resins is a cationic epoxy resin.

29. A method according to claim 23, wherein at least one of the resins contains a photoinitiator.

30. A method according to claim 23, wherein at least one of the resins contains at least one elasticizing-agent comprising at least one oligomeric alcohol.

31. A method according to claim 23, wherein the deposited band has a viscosity greater than or equal to 1500 poise.

32. A method according to claim 23, wherein the deposited filling has a viscosity less than or equal to 60 poise.

33. A method of protecting a portable electronic device with an integrated circuit provided with connections, comprising the following steps that are carried out one after the other:

depositing a resin band, polymerizable by ultraviolet, around the integrated circuit and its connections;

depositing a lower-viscosity filling resin, polymerizable by ultraviolet, in a space delimited by the band; and simultaneously polymerizing the two resins by exposure to ultraviolet radiation, wherein at least one of the resins contains at least one photoinitiator, and wherein said photoinitiator is triarylsulphonium salt.

34. The method according to claim 33, wherein the depositing and polymerizing steps are carried out continuously, wherein the step of depositing a resin band includes depositing a high viscosity resin band having a viscosity of the order of 1500 poise, and wherein the lower-viscosity filling resin has a viscosity of the order of 60 poise.

35. A method according to claim 33, wherein the filling resin has mechanical reinforcing fibers.

36. A method according to claim 35, wherein the percentage of fibers contained in the resin is between 5% and 20%.

37. The method of claim 35, wherein said reinforcing fibers are glass fibers.

38. A method according to claim 33, wherein at least one of the resins is a cationic epoxy resin.

39. A method according to claim 33, wherein at least one of the resins contains at least one monomer and/or oligomer that is polymerizable cationically under ultraviolet.

40. A method according to claim 33, wherein the deposited band has a viscosity greater than or equal to 1500 poise.

41. A method according to claim 33, wherein the deposited filling has a viscosity less than or equal to 60 poise.

* * * * *